(12) United States Patent
Liu et al.

(10) Patent No.: US 10,349,533 B1
(45) Date of Patent: Jul. 9, 2019

(54) MULTILAYER CIRCUIT BOARD AND METHOD OF MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Li-Kun Liu, Guangdong (CN); Yan-Lu Li, Guangdong (CN)

(73) Assignees: HongQiSheng Precision Electronics (QinHuangDao) Co., Ltd., Quinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/236,358

(22) Filed: Dec. 29, 2018

(30) Foreign Application Priority Data

Sep. 29, 2018 (CN) .......................... 2018 1 1152668

(51) Int. Cl.
| | |
|---|---|
| H05K 1/11 | (2006.01) |
| H05K 3/00 | (2006.01) |
| H05K 3/46 | (2006.01) |
| H05K 3/06 | (2006.01) |
| H05K 1/09 | (2006.01) |
| H05K 3/40 | (2006.01) |

(52) U.S. Cl.
CPC ............. *H05K 3/4611* (2013.01); *H05K 1/09* (2013.01); *H05K 1/115* (2013.01); *H05K 3/0094* (2013.01); *H05K 3/06* (2013.01); *H05K 3/4038* (2013.01); *H05K 2203/072* (2013.01); *H05K 2203/0776* (2013.01)

(58) Field of Classification Search
CPC ........ H05K 1/112; H05K 1/113; H05K 1/114; H05K 1/115; H05K 1/116; H05K 3/0094
See application file for complete search history.

(56) References Cited

U.S. PATENT DOCUMENTS

| | | | |
|---|---|---|---|
| 2008/0043444 A1* | 2/2008 | Hasegawa | H01L 33/642 361/717 |
| 2010/0224396 A1* | 9/2010 | Nomiya | H05K 3/4629 174/258 |

* cited by examiner

*Primary Examiner* — Jeremy C Norris
(74) *Attorney, Agent, or Firm* — ScienBiziP, P.C.

(57) ABSTRACT

A multilayer circuit board comprises an inner circuit board, a tin layer, at least one outer circuit board, and a solder mask. The inner circuit board comprises at least one first mounting region and at least one second mounting region. The tin layer is formed on a surface of the inner circuit board except the first mounting region connecting the outer circuit board. The outer circuit board comprises at least one first opening to expose the first mounting region and at least one second opening to expose a portion of the tin layer covering the second mounting region. The inner circuit board, the tin layer, and the outer circuit board together form a middle structure. The solder mask covers the middle structure except the portion and the first mounting region. A treatment layer is formed on the first mounting region.

15 Claims, 8 Drawing Sheets

MULTILAYER CIRCUIT BOARD AND METHOD OF MANUFACTURING THE SAME

FIELD

The subject matter herein generally relates to a circuit, especially relates to a multilayer circuit board and a method of manufacturing the multilayer circuit board.

BACKGROUND

A multilayer circuit board comprises a plurality of wiring substrates, and sometimes some of the wiring substrates need to be tinned.

At present, an opening is defined in the multilayer circuit board to expose the region that needs to be tinned, and then a tinning process is applied on the region to form a tin layer. The adhesive layers, the solder mask, and the wiring layer of the multilayer circuit board are exposed from the opening. When the tinning process is applied on the multilayer circuit board, the exposed adhesive layers, the exposed solder mask, and the exposed wiring layer may be damaged by Galvanic Corrosion which may result in a decrease in the stability of the multilayer circuit board. Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
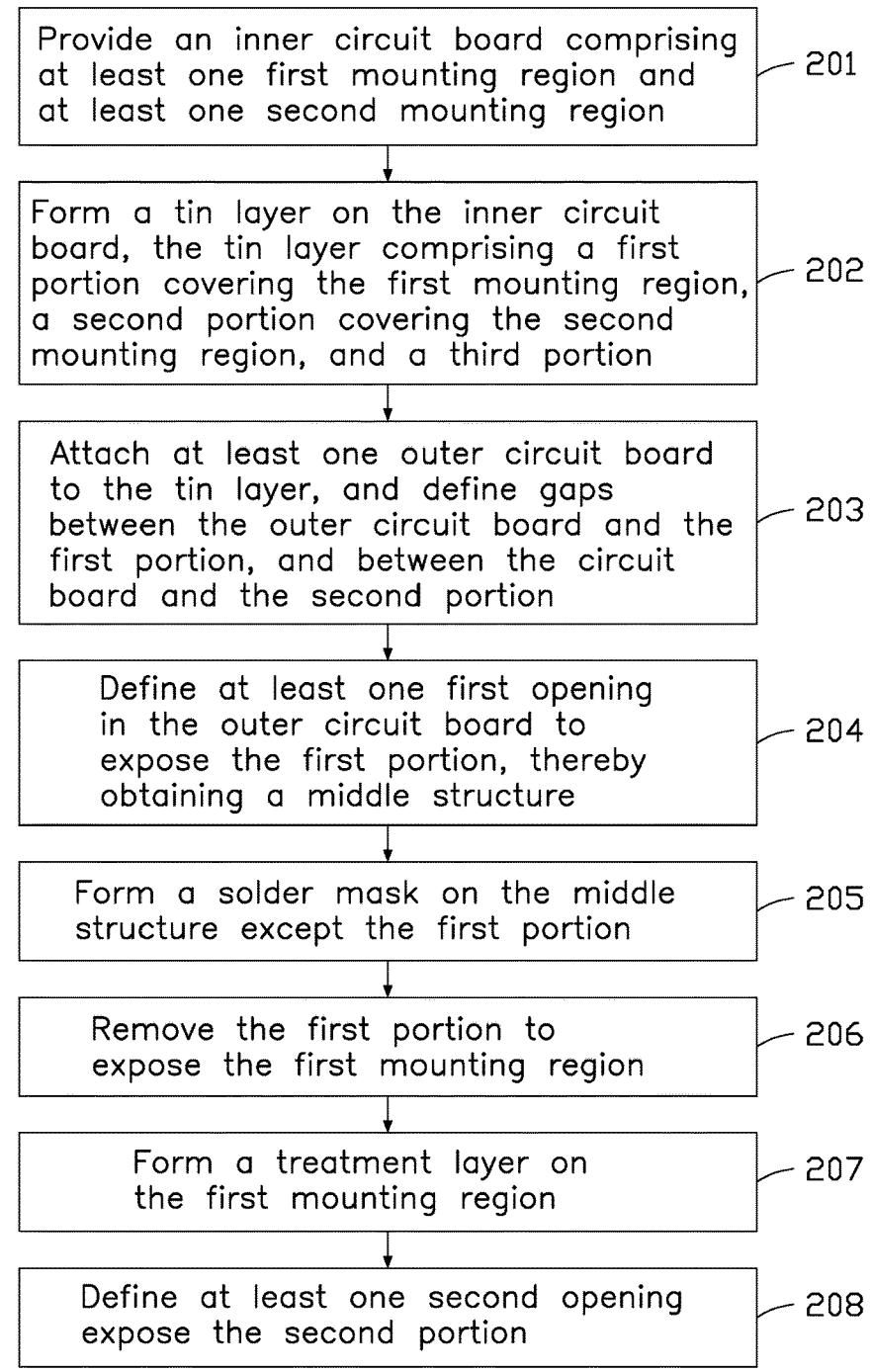
FIG. 1 is a flowchart of an embodiment of a method for manufacturing a multilayer circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The embodiment for manufacturing a multilayer circuit board 100 (shown in FIG. 9) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
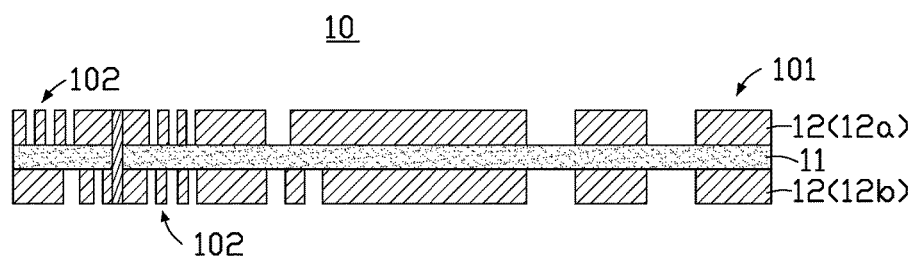
FIGS. 2-9 are cross-sectional views of illustrating respective steps of a method of manufacturing the multilayer circuit board.

At block 201, referring to FIG. 2, an inner circuit board 10 is provided. The inner circuit board 10 comprises at least one inner wiring layer 12 and at least one insulating base 11. Each of the at least one inner wiring layer 12 and each of the at least one insulating base 11 are alternatively arranged. That is, the inner circuit board 10 can be a double-sided wiring circuit board, a single-sided wiring circuit board, or a multilayer wiring circuit board. The at least one inner wiring layer 12 exposed from the insulating base 11 comprises at least one first mounting region 101 and at least one second mounting region 102.

In at least one embodiment, the inner circuit board 10 is double-sided wiring circuit board comprising a first inner wiring layer 12a, an insulating base 11, and a second inner wiring layer 12b arranged in that sequence. The first inner wiring layer 12a comprises a first mounting region 101 and a second mounting region 102. The second inner wiring layer 12b comprises a second mounting region 102.

In at least one embodiment, the at least one inner wiring layer 12 further comprises a third mounting region except the first mounting region 101 and the second mounting region 102. In at least one embodiment, a periphery of the first mounting region 101 connects the third mounting region.

Figure 3:
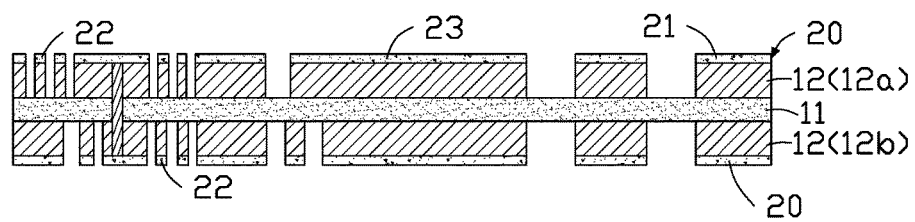

At block 202, referring to FIG. 3, a tin layer 20 is formed on the inner circuit board 10. The tin layer 20 is formed on a whole surface of the inner wiring layer 12 exposed from the insulating base 11 and facing away from the insulating base 11 by a process of electroless tin plating. The tin layer 20 comprises a first portion 21 covering the first mounting region 101, a second portion 22 covering the second mounting region 102, and a third portion 23 except the first portion 21 and the second portion 22.

The tin layer 20 formed on the whole surface of the inner wiring layer 12 can avoid an imprecision of tinning area when the tin layer is formed on the partial surface.

In at least one embodiment, the tin layer 20 covers a surface of the first inner wiring layer 12a facing away from the insulating base 11 and a surface of the second inner wiring layer 12b facing away from the insulating base 11.

In at least one embodiment, a thickness of the tin layer 20 is less than 1 μm. In another embodiment, the thickness of the tin layer 20 can be varied as needed.

Figure 4:
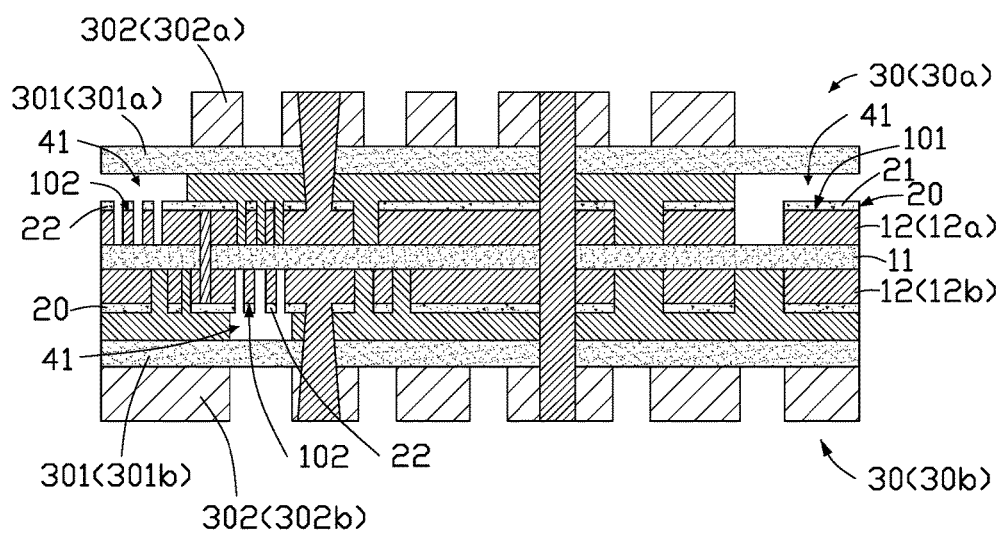

At block 203, referring to FIG. 4, at least one outer circuit board 30 is attached to the tin layer 20. Gaps 41 are defined between the outer circuit board 30 and the first portion 21, and defined between the circuit board 30 and the second portion 22. The outer circuit board 30 is electrically connected to the inner circuit board 10.

Each of the outer circuit board 30 comprises at least one outer wiring layer 302 and at least one insulating layer 301. Each of the at least one outer wiring layer 302 and each of the at least one insulating layer 302 are alternatively arranged. Each of the outer circuit board 30 is attached to the inner circuit board 10 through one of the at least one insulating layer 301.

In at least one embodiment, a first outer circuit board 30a formed on the tin layer 20 covers the first inner wiring layer 12a, and a second outer circuit board 30b formed on the tin layer 20 covers the second inner wiring layer 12b. The first outer circuit board 30a and the second outer circuit board 30b are electrically connected to the inner circuit board 10.

The first outer circuit board 30a is a single-sided wiring circuit board comprising a first insulating layer 301a and a first outer wiring layer 302a formed on the first insulating layer 301a. The second outer circuit board 30b is a single-sided wiring circuit board comprising a second insulating layer 301b and a second outer wiring layer 302b formed on the second insulating layer 301b. The first insulating layer 301a and the second insulating layer 301b are attached to the tin layer 20 by an adhesive layer 40. The adhesive layer 40 covers the third portion 23 of the tin layer 20, thereby defining gaps 41 between the first insulating layer 301a and the first portion 21 covering the first inner wiring layer 12a, between the first insulating layer 301a and the second portion 22 covering the first inner wiring layer 12a, and between the second insulating layer 301b and the second portion 22 covering second inner wiring layer 12b.

The first outer wiring layer 302a, the second outer wiring layer 302b, the first inner wiring layer 12a, and the second inner wiring layer 12b are electrically connected with each other.

Figure 5:
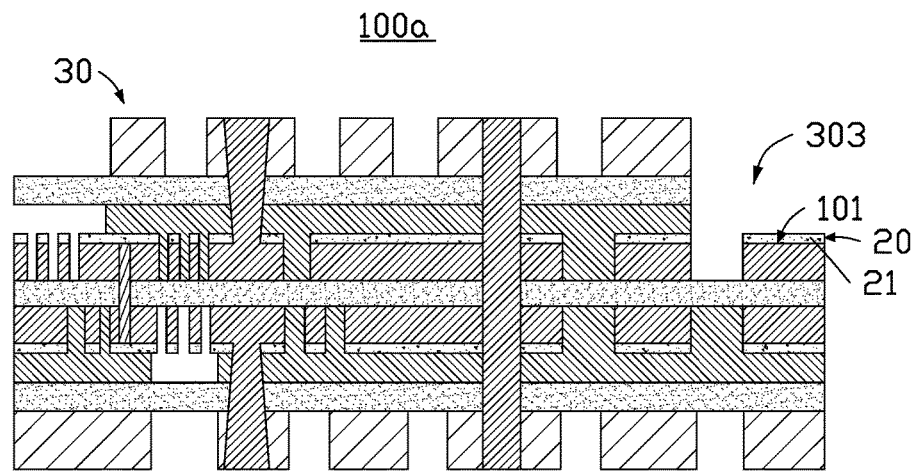

At block 204, referring to FIG. 5, at least one first opening 303 is defined in the outer circuit board 30 to expose the first portion 21, thereby obtaining a middle structure 100a.

Figure 6:
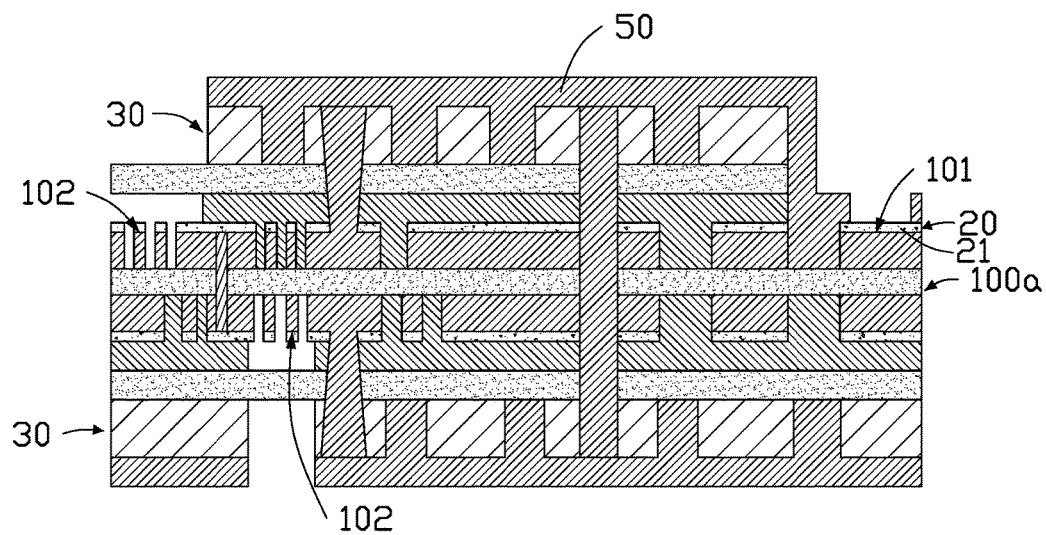

At block 205, referring to FIG. 6, a solder mask 50 is formed on an exposed surface of the middle structure 100a except the first portion 21.

The solder mask 50 can be made by CVL, PI or ink etc.

In at least one embodiment, the outer circuit board 30 corresponding to the first mounting region 102 can be exposed from the solder mask 50.

Figure 7:
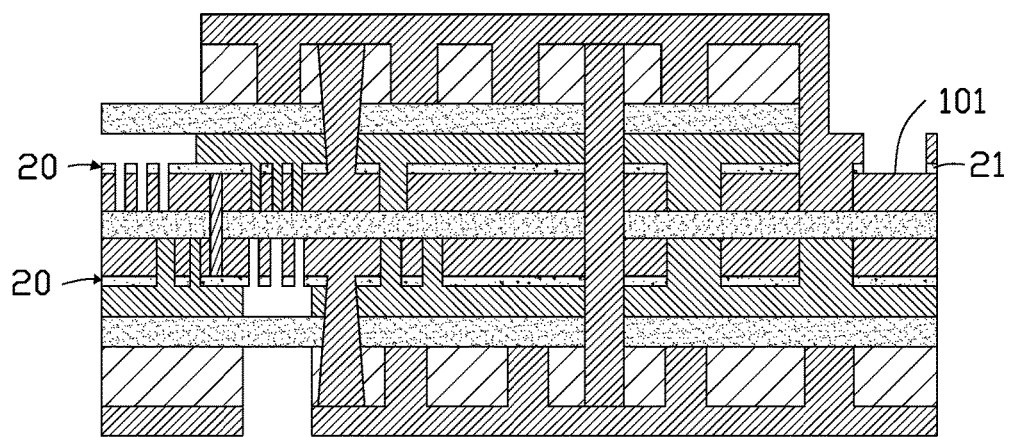

At block 206, referring to FIG. 7, the first portion 21 is removed to expose the first mounting region 101.

In at least one embodiment, the first portion 21 is etched by a tin etching liquid.

Figure 8:
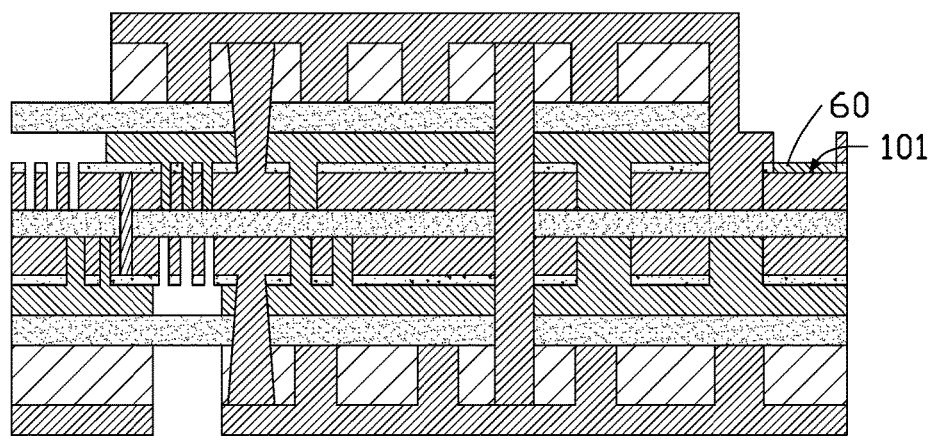

At block 207, referring to FIG. 8, a surface treatment is applied on the exposed first mounting region 101 to form a treatment layer 60 to weld an electronic element.

In at least one embodiment, the surface treatment may be an electroless gold plating process, an electropilding process, an Organic Solderability Preservatives (OSP) process or an ENEPIG process.

In at least one embodiment, a periphery of the treatment layer 60 connects the tin layer 20.

Figure 9:
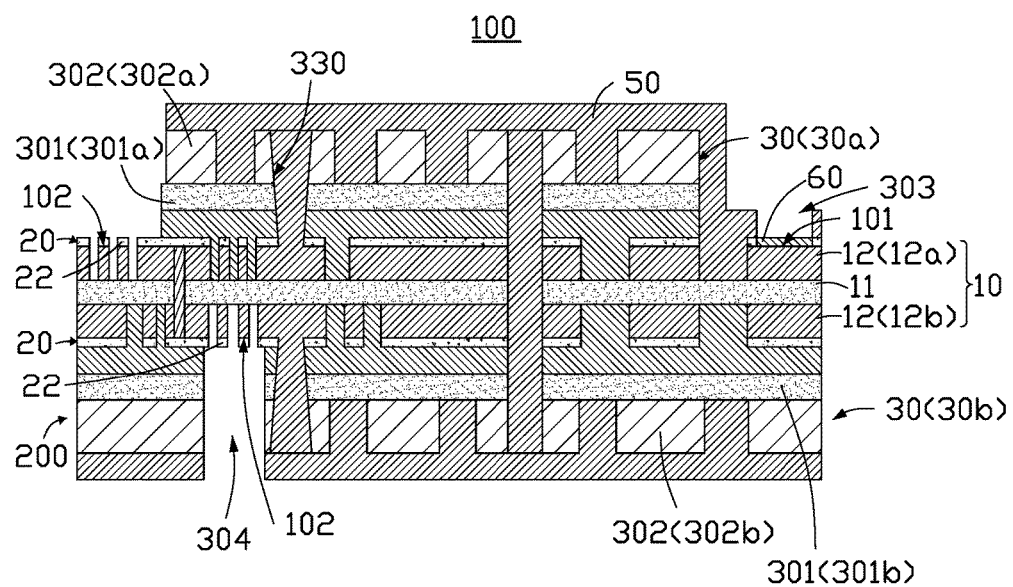

At block 208, referring to FIG. 9, at least one second opening 304 is defined in the outer circuit board 30 covered by the solder mask 50 to expose the second portion 22, thereby obtaining a multilayer circuit board 100.

Figure 10:
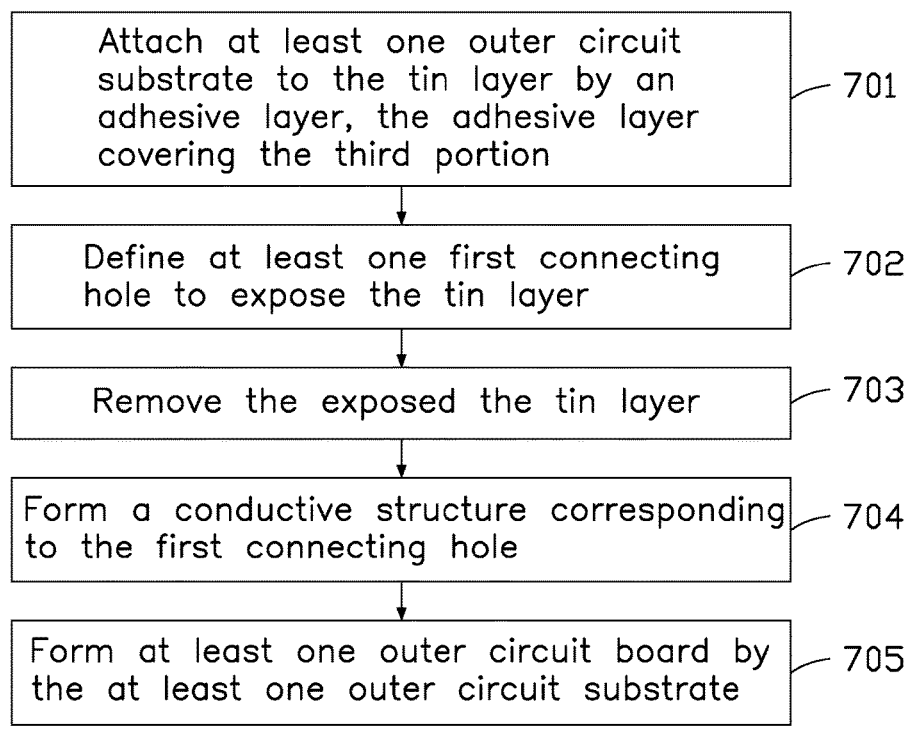
FIG. 10 is a flowchart of an embodiment of a method for manufacturing an outer circuit board.

FIG. 10 illustrates a flowchart of a method for manufacturing the at least one outer circuit board 30. The method can begin at block 701.

Figure 11:
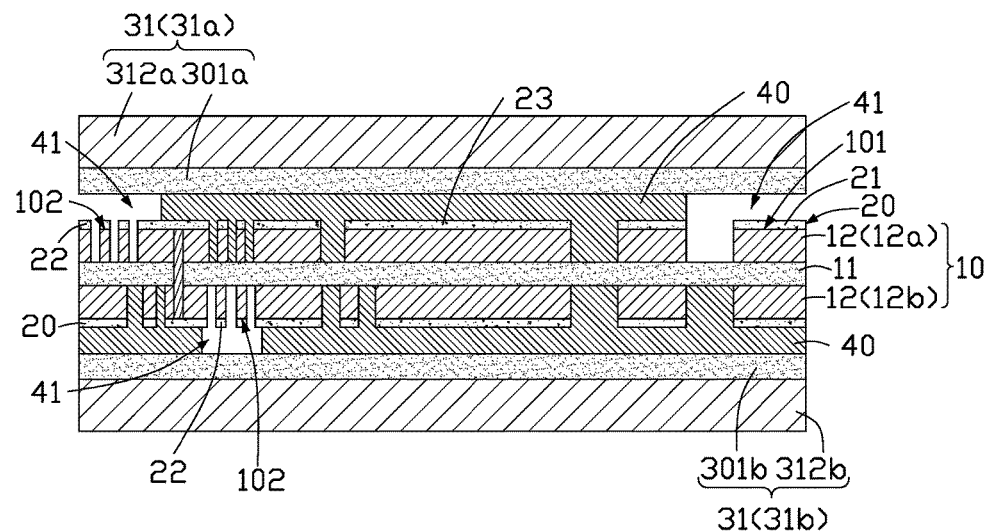
FIGS. 11-14 are cross-sectional views of illustrating respective steps of a method of manufacturing the outer circuit board.

At block 701, referring to FIG. 11, at least one outer circuit substrate 31 is attached to the tin layer 20 by an adhesive layer 40. The adhesive layer 40 covers the third portion 23, and gaps 41 are defined between the at least one outer circuit substrate 31 and the first portion 21, and between the at least one outer circuit substrate 31 and the second portion 22.

In at least one embodiment, a first outer circuit substrate 31a attached to the tin layer 20 covers the first inner wiring layer 12a, and a second outer circuit substrate 31b attached to the tin layer 20 covers the second inner wiring layer 12b.

The first outer circuit substrate 31a comprises a first insulating layer 301a and a first copper foil 312a formed on the first insulating layer 301a. The second outer circuit substrate 31b comprises a second insulating layer 301b and a second copper foil 312b. A surface of the first insulating layer 301a facing away from the first copper foil 312a and a surface of the second insulating layer 301b facing away from the second copper foil 312b are attached to the tin layer 20 covering two sides of the inner circuit board 10 by the adhesive layer 40. Gaps 41 are defined between the first insulating layer 301a and the first portion 21 covering the first inner wiring layer 12a, defined between the first insulating layer 301a and the second portion 22 covering the first inner wiring layer 12a, and defined between the second insulating layer 301b and the second portion 22 covering second inner wiring layer 12b.

Figure 12:
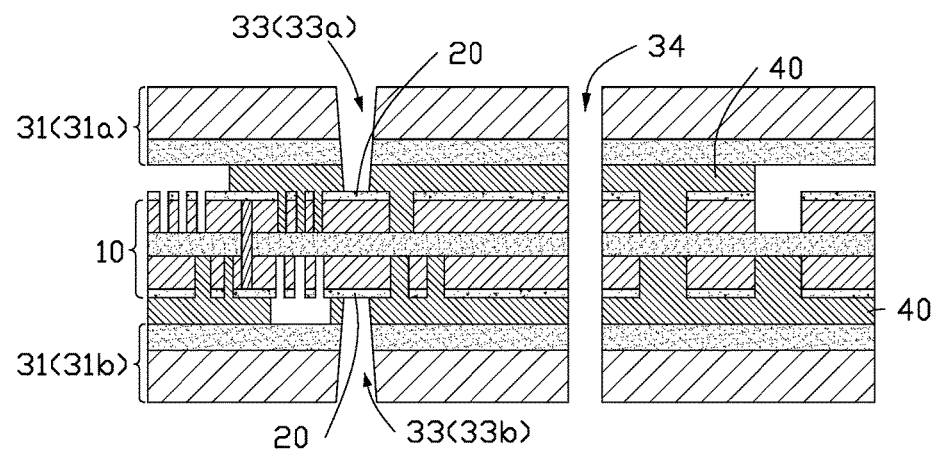

At block 702, referring to FIG. 12, at least one first connecting hole 33 is defined through the at least one outer circuit substrate 31 and the adhesive layer 40 to expose the tin layer 20. At least one second connecting hole 34 is defined through the at least one outer circuit substrate 31, the adhesive layer 40, and the inner circuit board 10.

In at least one embodiment, a first connecting hole 33a is defined through the first outer circuit substrate 31a and the adhesive layer 40, a first connecting hole 33b is defined through the second outer circuit substrate 31b and the adhesive layer 40, a second connecting hole 34 is defined through the first outer circuit substrate 31a, the adhesive layer 40, the inner circuit board 10, and the second outer circuit substrate 31b.

Figure 13:
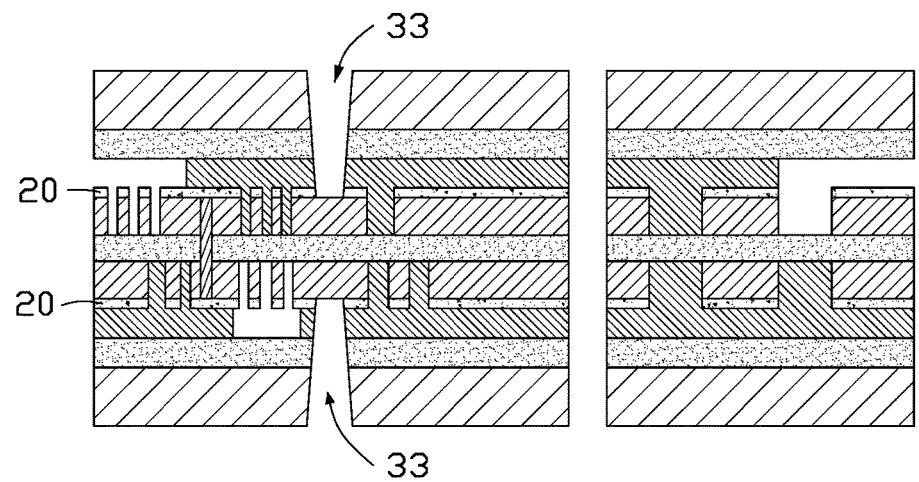

At block 703, referring to FIG. 13, the tin layer 20 exposed from the at least one first connecting hole 33 is removed.

Figure 14:
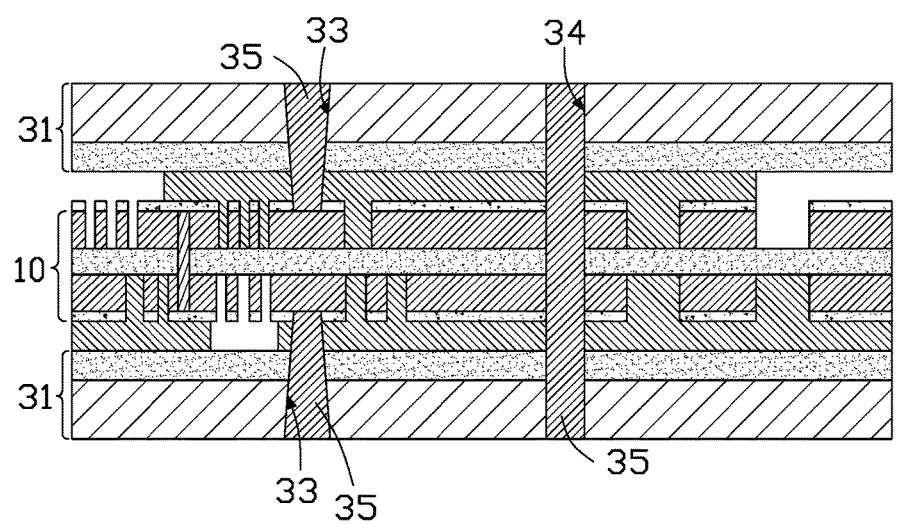

At block 704, referring to FIG. 14, a conductive structure 35 is formed corresponding to the at least one first connecting hole 33 and the at least one second connecting hole 34, to electrically connect the at least one outer circuit substrate 31 and the inner circuit board 10.

At block 705, referring to FIGS. 4 and 11, at least one outer circuit board 30 is formed by the at least one outer circuit substrate 31.

In at least one embodiment, a first outer wiring layer 302a is formed by the first copper foil 312a, to cause the first outer circuit substrate 31a to form a first outer circuit board 30a, and a second outer wiring layer 302b is formed by the second copper foil 312b, to cause the second outer circuit substrate 31b to form a second outer circuit board 30b.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 9 illustrates an embodiment of a multilayer circuit board 100. The multilayer circuit board 100 comprises an inner circuit board 10, at least one outer circuit board 30, and a solder mask 50. The inner circuit board 10 and the at least one outer circuit board 30 are arranged in a sequence. The inner circuit board 10 comprises at least one first mounting region 101 and at least one second mounting region 102. The multilayer circuit board 100 further comprises a tin layer 20. The tin layer 20 is formed on a surface of the inner circuit board 10 connecting the at least one outer circuit board 30 except the first mounting region 101. The at least one outer circuit board 30 comprises at least one first opening 303 and at least one second opening 304. The first mounting region 101 is exposed from the at least one first opening 303. A portion of the tin layer 20 covering the second mounting region 102 is exposed from the at least one second opening 304. The inner circuit board 10, the tin layer 20, and the at least one outer circuit board 30 together form a middle structure 200. The solder mask 50 covers the middle structure 200 except a portion exposed from the second opening 304 and except the first mounting region 101. A treatment layer 60 is formed on a surface of the first mounting region 101 exposed.

The inner circuit board 10 comprises at least one inner wiring layer 12 and at least one insulating base 11. Each of the at least one inner wiring layer 12 and each of the at least one insulating base 11 are alternatively arranged. That is, the inner circuit board 10 can be a double-sided wiring circuit board, a single-sided wiring circuit board, or a multilayer wiring circuit board. The at least one inner wiring layer 12 exposed from the insulating base 11 comprises at least one first mounting region 101 and at least one second mounting region 102.

In at least one embodiment, the inner circuit board 10 is a double-sided wiring circuit board comprising a first inner wiring layer 12a, an insulating base 11, and a second inner wiring layer 12b arranged in that sequence. The first inner wiring layer 12a is electrically connected to the second inner wiring layer 12b. The first inner wiring layer 12a comprises a first mounting region 101 and a second mounting region 102. The second inner wiring layer 12b comprises a second mounting region 102.

The tin layer 20 is formed on a surface of the inner wiring layer 12 exposed from the insulating base 11 and facing away from the insulating base 11. The first mounting region 101 is exposed from tin layer 20.

In at least one embodiment, the tin layer 20 is formed on a surface of the first inner wiring layer 12a facing away from the insulating base 11, and a surface of the second inner wiring layer 12b facing away from the insulating base 11. The first mounting region 101 is exposed from tin layer 20.

In at least one embodiment, a thickness of the tin layer 20 is less than 1 μm. In another embodiment, the thickness of the tin layer 20 can be varied as needed.

Each of the outer circuit board 30 comprises at least one outer wiring layer 302 and at least one insulating layer 301. Each of the at least one outer wiring layer 302 and each of the at least one insulating layer 302 are alternatively arranged.

In at least one embodiment, the at least one outer circuit board 30 comprises a first outer circuit board 30a and a second outer circuit board 30b.

The first outer circuit board 30a comprises a first insulating layer 301a and a first outer wiring layer 302a formed on the first insulating layer 301a. The second outer circuit board 30b comprises a second insulating layer 301b and a second outer wiring layer 302b formed on the second insulating layer 301b.

A surface of the first insulating layer 301a facing away from the first outer wiring layer 302a is attached to the tin layer 20 covering the first inner wiring layer 12a by an adhesive layer 40. A surface of the second insulating layer 301b facing away from the second outer wiring layer 302b is attached to the tin layer 20 covering the second inner wiring layer 12b by an adhesive layer 40.

The first mounting region 101 covered by the treatment layer 60 is exposed from the first outer circuit board 30a. The second mounting regions 102 covered by the tin layer 20 are exposed from the first outer circuit board 30a and the second outer circuit board 30b.

The multilayer circuit board 100 further comprises at least one connecting hole 330 passing through the at least one outer circuit board 30, the adhesive layer 40, and the tin layer 20 to expose the inner circuit board 10. A conductive structure 35 is formed in each of the at least one connecting hole 330 to electrically connect the at least one outer circuit board 30 and the inner circuit board 10.

The solder mask 50 can be made by CVL, PI or ink etc.

In the method of for manufacturing a multilayer circuit board 100, the tin layer 20 is formed before the at least one outer circuit board 30 and the solder mask 50 are formed, thereby preventing the at least one outer circuit board 30 and the solder mask 50 from damaging formation of the tin layer 20. So that strength and stability of the multilayer circuit board 100 can be improved. The first mounting region 101 covered by the treatment layer 60 and second mounting region 102 covered by the tin layer 20 exist in the multilayer circuit board 100 at the same time, as a result, the multilayer circuit board 100 can meet various assembly requirements, such as assembly by anisotropic conductive adhesive, thermal compression bonding, and Surface Mount Technology (SMT) at the same time.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A multilayer circuit board comprising:
   an inner circuit board comprising at least one first mounting region and at least one second mounting region;
   at least one outer circuit board formed on the inner circuit board;
   a solder mask; and
   a tin layer formed on a surface of the inner circuit board connecting the at least one outer circuit board except the at least one first mounting region;
   wherein the at least one outer circuit board comprises at least one first opening and at least one second opening; the at least one first mounting region is exposed from the at least one first opening, a portion of the tin layer covering the at least one second mounting region is exposed from the at least one second opening; the inner circuit board, the tin layer, and the at least one outer circuit board together form a middle structure; the solder mask covers the middle structure except the at least one first mounting region and the portion of the tin layer covering the at least one second mounting region; a treatment layer is formed on the at least one first mounting region.

2. The multilayer circuit board r of claim 1, wherein a periphery of the treatment layer connects the tin layer.

3. The multilayer circuit board of claim 1, wherein a thickness of the tin layer is less than 1 μm.

4. The multilayer circuit board of claim 1, wherein the multilayer circuit board further comprises at least one connecting opening passing through the at least one outer circuit board and the tin layer to expose the inner circuit board, a conductive structure is formed in each of the at least one connecting opening to electrically connect the at least one outer circuit board and the inner circuit board.

5. The multilayer circuit board of claim 1, wherein each of the at least one outer circuit board comprises at least one outer wiring layer and at least one insulating layer, each of the at least one outer wiring layer and each of the at least one insulating layer are alternatively arranged, each of the at least one outer circuit board is attached to the inner circuit board through one of the at least one insulating layer.

6. The multilayer circuit board of claim 1, wherein the multilayer circuit board further comprises an adhesive layer, the at least one outer circuit board is attached to the inner circuit board by the adhesive layer.

7. A method for manufacturing a multilayer circuit board comprising:
provide an inner circuit board comprising at least one first mounting region and at least one second mounting region;
forming a tin layer on the inner circuit board;
attaching at least one outer circuit board to the tin layer;
defining at least one first opening in the at least one outer circuit board to expose a portion of the tin layer covering the at least one first mounting region, thereby obtaining a middle structure;
forming a solder mask on the surface of the middle structure except the portion of the tin layer covering the at least one first mounting region;
removing the portion of the tin layer covering the at least one first mounting region, and forming a treatment layer on the at least one first mounting region; and
defining at least one second opening in the at least one outer circuit board covered by the solder mask to expose a portion of the tin layer covering the at least one second mounting region, and obtaining the multilayer circuit board.

8. The method for manufacturing a multilayer circuit board of claim 7, wherein a periphery of the treatment layer connects the tin layer.

9. The method for manufacturing a multilayer circuit board of claim 7, wherein a thickness of the tin layer is less than 1 μm.

10. The method for manufacturing a multilayer circuit board of claim 7, wherein the inner circuit board comprising at least one inner wiring layer and at least one insulating base, the at least one inner wiring layer, the tin layer on the at least one inner wiring layer facing away from the at least one insulating base, the tin layer comprises a first portion, a second portion and a third portion except the first portion and the second portion, the first portion covers the at least one first mounting region, the second portion covers the at least one second mounting region.

11. The method for manufacturing a multilayer circuit board of claim 10, wherein the first portion is removed by etching.

12. The method for manufacturing a multilayer circuit board of claim 10, wherein attaching at least one outer circuit board to the tin layer further comprises:
defining gaps between the at least one outer circuit board and the first portion, and between the at least one outer circuit board and the second portion.

13. The method for manufacturing a multilayer circuit board of claim 10, wherein the at least one outer circuit board is attached to the tin layer by an adhesive layer, and the adhesive layer covers the third portion.

14. The method for manufacturing a multilayer circuit board of claim 13, wherein the multilayer circuit board further comprises at least one conductive structure passing through the at least one outer circuit board and the adhesive layer, to electrically connect the at least one outer circuit board and the inner circuit board.

15. The method for manufacturing a multilayer circuit board of claim 7, wherein each of the at least one outer circuit board comprises at least one outer wiring layer and at least one insulating layer, each of the at least one outer wiring layer and each of the at least one insulating layer are alternatively arranged, each of the at least one outer circuit board is attached to the inner circuit board through one of the at least one insulating layer.

* * * * *